United States Patent
Chitiboi et al.

(10) Patent No.: US 11,308,613 B2
(45) Date of Patent: Apr. 19, 2022

(54) SYNTHESIS OF CONTRAST ENHANCED MEDICAL IMAGES

(71) Applicant: Siemens Healthcare GmbH, Erlangen (DE)

(72) Inventors: Teodora Chitiboi, Jersey City, NJ (US); Puneet Sharma, Princeton Junction, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 10 days.

(21) Appl. No.: 16/946,184

(22) Filed: Jun. 9, 2020

(65) Prior Publication Data
US 2021/0383537 A1 Dec. 9, 2021

(51) Int. Cl.
G06T 7/00 (2017.01)
G01R 33/56 (2006.01)
G06T 7/11 (2017.01)

(52) U.S. Cl.
CPC ........ *G06T 7/0012* (2013.01); *G01R 33/5601* (2013.01); *G06T 7/11* (2017.01); *G06T 2207/10096* (2013.01); *G06T 2207/20081* (2013.01); *G06T 2207/20084* (2013.01); *G06T 2207/30004* (2013.01)

(58) Field of Classification Search
CPC ............. G06T 7/0012; G06T 7/11; G06T 2207/10096; G06T 2207/20081; G06T 2207/20084; G06T 2207/30004; G01R 33/5601; G01R 33/56325; G01R 33/5608
See application file for complete search history.

(56) References Cited

U.S. PATENT DOCUMENTS

2019/0125206 A1* 5/2019 Kristanto ............. G06K 9/6207

FOREIGN PATENT DOCUMENTS

WO WO-2020120238 A1 * 6/2020 ............. G06T 7/174

OTHER PUBLICATIONS

Xiong et al. "Fully Automatic Left Atrium Segmentation from Late Gadolinium Enhanced Magnetic Resonance Imaging Using a Dual Fully Convolutional Neural Network." IEEE Transactions on Medical Imaging vol. 38, No. 2, Feb. 2019, pp. 515-524 (Year: 2019).*
Kim et al. "Contrast CT image generation model using CT image of PET/CT." IEEE Nuclear Science Symposium and Medical Imaging Conference Proceedings, Nov. 10, 2018, 3 pages (Year: 2018).*
Dar et al. "Image Synthesis in Multi-Contrast MRI With Conditional Generative Adversarial Networks." IEEE Transactions on Medical Imaging, vol. 38, No. 10, Oct. 2019, pp. 2375-2388 (Year: 2019).*
Yue et al., "Cardiac Segmentation from LGE MRI Using Deep Neural Network Incorporating Shape and Spatial Priors", arXiv preprint arXiv: 1906.07347, Jun. 18, 2019, pp. 1-8.

(Continued)

*Primary Examiner* — Jon Chang

(57) ABSTRACT

Systems and methods for generating a synthesized contrast enhanced medical image are provided. An input medical image is received. A synthesized contrast enhanced medical image is generated based on the input medical image using a trained machine learning based generator network. The synthesized contrast enhanced medical image includes one or more synthesized contrast enhanced regions of pathological tissue. The synthesized contrast enhanced medical image is output.

20 Claims, 7 Drawing Sheets

(56) References Cited

OTHER PUBLICATIONS

Kitchen et al., "Deep Generative Adversarial Neural Networks for Realistic Prostate Lesion MRI Synthesis", arXiv preprint arXiv:1708.00129, Aug. 1, 2017, pp. 1-8.
Han et al., "GAN-Based Synthetic Brain MR Image Generation", IEEE 15th International Symposium on Biomedical Imaging (ISBI 2018), Washington, DC, 2018, 5 pgs.
Gong et al., "Deep Learning Enables Reduced Gadolinium Dose for Contrast-Enhanced Brain MRI", Journal of Magnetic Resonance Imaging, International Society for Magnetic Resonance in Medicine, 2018, pp. 1-11.
Radford et al., "Unsupervised Representation Learning with Deep Convolutional Generative Adversarial Networks", arXiv preprint arXiv:1511.06434v2, Jan. 7, 2016, pp. 1-16.
Zhu et al., "Unpaired Image-to-Image Translation Using Cycle-Consistent Adversarial Networks", Proceedings of the IEEE International Conference on Computer Vision, arXiv preprint arXiv:1903.07291 v2, Nov. 15, 2018, 18 pgs.
Park et al., "Semantic Image Synthesis with Spatially-Adaptive Normalization", Proceedings of the IEEE Conference on Computer Vision and Pattern Recognition, arXiv preprint arXiv:1903.07291v2, Nov. 5, 2019, pp. 1-19.

\* cited by examiner

100

---

Receive an input medical image and an enhancement map defining one or more regions of the input medical image to be contrast enhanced
102

Generate a synthesized contrast enhanced medical image based on the input medical image using a trained machine learning based generator network
104

Output the synthesized contrast enhanced medical image
106

SYNTHESIS OF CONTRAST ENHANCED MEDICAL IMAGES

TECHNICAL FIELD

The present invention relates generally to synthesis of contrast enhanced medical images, and in particular to synthesis of LGE (late gadolinium enhancement) MRI (magnetic resonance imaging) images for training machine learning based systems for performing medical image analysis tasks.

BACKGROUND

LGE (late gadolinium enhancement) MRI (magnetic resonance imaging) imaging is performed by administering a gadolinium-based contrast agent to a patient and imaging the patient after a time delay to achieve optimum contrast between normal healthy tissue and pathological tissue. LGE MRI imaging plays an important role in the noninvasive assessment of myocardial tissue. In the current clinical practice, a radiologist reads LGE MRI images to assess myocardial tissue. Automatic segmentation of LGE enhanced regions of myocardial tissue in LGE MRI images would reduce the time spent by radiologists in reading LGE MRI images, as well as reduce the variability and subjectivity in reading LGE MRI images. As such, machine learning based systems for automatically segmenting LGE enhanced regions from LGE MRI images would be useful. However, the availability of appropriate imaging data and annotations for training such machine learning based systems is limited. Larger pathological datasets are needed to train robust machine learning based systems.

BRIEF SUMMARY OF THE INVENTION

In accordance with one or more embodiments, systems and methods for generating a synthesized contrast enhanced medical image are provided. An input medical image is received. A synthesized contrast enhanced medical image is generated based on the input medical image using a trained machine learning based generator network. The synthesized contrast enhanced medical image includes one or more synthesized contrast enhanced regions of pathological tissue. The synthesized contrast enhanced medical image is output.

In one embodiment, the synthesized contrast enhanced medical image comprises a random pattern of the one or more synthesized contrast enhanced regions.

In one embodiment, an enhancement map defining one or more regions of the input medical image to be contrast enhanced is received and the synthesized contrast enhanced medical image is generated based on the enhancement map. The one or more synthesized contrast enhanced regions of pathological tissue in the synthesized contrast enhanced medical image are generated in the one or more regions defined by the enhancement map. The enhancement map may be generated based on a thresholded strain map or a segmentation mask associated with an anatomically similar patient In one embodiment, a segmentation mask of an anatomical structure depicted in the input medical image (e.g., the myocardium) is also received and the synthesized contrast enhanced medical image is generated based on the segmentation mask.

In one embodiment, a segmentation mask of an anatomical structure depicted in the synthesized contrast enhanced medical image may be determined as a segmentation mask of the anatomical structure in the input medical image. In another embodiment, the segmentation mask of an anatomical structure depicted in the synthesized contrast enhanced medical image may be determined by generating a paired non-enhanced medical image of the anatomical structure depicted in the synthesized contrast enhanced medical image using another generator network and determining a segmentation mask of the generated paired non-enhanced medical image.

In one embodiment, a machine learning based system may be trained for performing a medical image analysis task based on the synthesized contrast enhanced medical image.

In one embodiment, the input medical image is a cine MRI (magnetic resonance imaging) image and the synthesized contrast enhanced medical image is a synthesized LGE (late gadolinium enhancement) MRI image.

These and other advantages of the invention will be apparent to those of ordinary skill in the art by reference to the following detailed description and the accompanying drawings.

DETAILED DESCRIPTION

The present invention generally relates to methods and systems for the synthesis of contrast enhanced medical images. Embodiments of the present invention are described herein to give a visual understanding of such methods and systems. A digital image is often composed of digital representations of one or more objects (or shapes). The digital representation of an object is often described herein in terms of identifying and manipulating the objects. Such manipulations are virtual manipulations accomplished in the memory or other circuitry/hardware of a computer system. Accordingly, is to be understood that embodiments of the present invention may be performed within a computer system using data stored within the computer system.

LGE (late gadolinium enhancement) MRI (magnetic resonance imaging) imaging plays an important role in the non-invasive assessment of myocardial tissue. Machine learning based systems for automatically segmenting LGE enhanced regions of the LGE MRI imaging would be helpful for a fast and reproducible analysis. However, the availability of annotated imaging data suitable for training such machine learning based systems is limited.

Embodiments described herein provide for generating synthesized LGE MRI medical images of pathological tissue from cine-MRI medical images of healthy tissue. Such synthesized LGE MRI medical images are generated using a GAN (generative adversarial network) to provide realistic looking synthesized LGE MRI medical images. Advantageously, such synthesized LGE MRI medical images of pathological tissue may be utilized for training machine learning based systems for performing medical image analysis tasks, such as, e.g., segmentation of LGE enhanced regions of LGE MRI medical images. Such machine learning based systems trained using the synthesized LGE MRI medical images in accordance with embodiments described herein are more robust to various types of pathological tissue.

Figure 1:
FIG. 1 shows a method for generating a synthesized contrast enhanced medical image, in accordance with one or more embodiments.
Figure 1:

FIG. 1 shows a method 100 for generating a synthesized contrast enhanced medical image, in accordance with one or more embodiments. The steps of method 100 may be performed by one or more computing devices, such as, e.g., computer 702 of FIG. 7.

At step 102, an input medical image is received. The input medical image depicts healthy tissue of an anatomical structure of a patient. For example, the input medical image may depict healthy tissue of the myocardium of the patient. However, it should be understood that the anatomical structure may be any anatomical structure of the patient.

In one embodiment, the input medical image is a cine MRI image, which may be provided in short-axis or long-axis orientation. However, the input medical image may be of any suitable modality, such as, e.g., MRI, US (ultrasound), x-ray, or any other modality or combination of modalities. The input medical image may be a single medical image or a medical image sequence comprising a plurality of images acquired over time, and may be a 2D image or 3D volume. In one embodiment, the medical image sequence is of myocardial tissue acquired over at least one full cardiac cycle (i.e., at least systole and diastole), thereby depicting the relationship between myocardium displacement from end-systole to end-diastole and the contrast enhancement pattern. The input medical image may be received directly from an image acquisition device, such as, e.g., an MRI scanner, as the input medical image is acquired, or can be received by loading a previously acquired input medical image from a storage or memory of a computer system or receiving the input medical image from a remote computer system.

Figure 2:
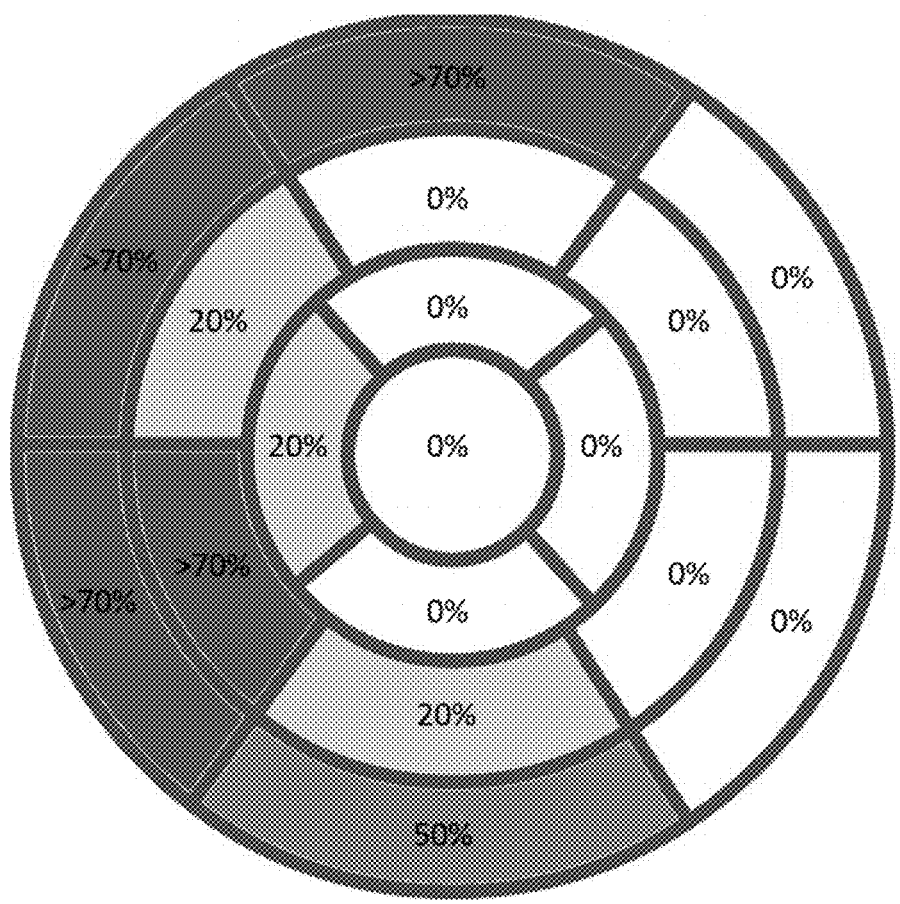
FIG. 2 shows an exemplary 17-segment model, in accordance with one or more embodiments.

In one embodiment, an enhancement map is also optionally received. The enhancement map defines one or more regions of the input medical image to be contrast enhanced. The enhancement map may be in any suitable form. In one embodiment, the enhancement map is segmentation mask of the regions to be contrast enhanced, such as, e.g., a pixel- (or voxel)-wise binary segmentation mask. In another embodiment, the enhancement map is a segment model, such as, e.g., a 17-segment model (e.g., based on the American Heart Association 17-segment model). In the segment model, each segment may be pathological tissue or healthy tissue, or a combination of both represented as a percentage. FIG. 2 shows an exemplary 17-segment model 200, in accordance with one or more embodiments. As shown in FIG. 2, each segment of 17-segment model 200 is assigned a percentage representing the percentage of pathological tissue (or healthy tissue is some embodiments) in that segment. Additional properties, such as, e.g., size and transmurality, for each segment may also be defined as additional input.

The enhancement map may be generated using any suitable approach. In one embodiment, the enhancement map is automatically generated from clinical reports using natural language processing. In another embodiment, the enhancement map may be generated based on a thresholded strain map. For example, regions in a strain map with a strain magnitude below a particular threshold may be designated as regions of pathological tissue to be contrast enhanced. In another embodiment, the enhancement map may be generated based on a T1 map. In another embodiment, the enhancement map may be manually generated based on input from a user (e.g., manually drawing the enhancement map). In another embodiment, the enhancement map may be generated based on a registered segmentation mask from an anatomically similar patient using, e.g., rigid and/or elastic registration. The anatomically similar patient has anatomical structures that are similar to the anatomical structures shown in the input medical image. For example, the anatomically similar patient may have a heart chamber and myocardium that is similar in size as the heat chamber and myocardium shown in the input medical image.

In one embodiment, segmentation masks for anatomical structures in the input medical image is also optionally received. For example, the segmentation mask may be for the left ventricle, right ventricle, and the myocardium.

At step 104, a synthesized contrast enhanced medical image is generated based on the input medical image using a trained machine learning based generator network. In one embodiment, the synthesized contrast enhanced medical image is a synthesized LGE MRI medical image. However, the synthesized contrast enhanced medical image may be any synthesized medical image of the input medical image that is contrast enhanced (e.g., using any suitable form of contrast enhancement).

The synthesized contrast enhanced medical image comprises one or more synthesized contrast enhanced regions of pathological tissue. The synthesized contrast enhanced regions depict contrast enhancement patterns, such as, e.g., ischemic, hypertrophic cardiomyopathy, amyloidosis, etc. corresponding to a particular pathology. The synthesized contrast enhanced medical image also comprises a synthesized version of the input medical image in regions outside of the contrast enhanced regions. The synthesized version of the input medical image in regions outside of the contrast enhanced regions may be generated by regenerating the regions of the input medical image outside of the contrast enhanced regions or by copying imaging data of the regions outside of the contrast enhanced regions from the input medical image.

In operation, the generator network receives as input the input medical image (and optionally the enhancement map and/or the segmentation masks) and outputs the synthesized contrast enhanced medical image. In one embodiment, the trained machine learning based network is a GAN. However, any other suitable machine learning based network may additionally or alternatively be employed. For example, in one embodiment, the trained machine learning based network is a cycleGAN or SPADE GAN that generates images with improved quality as compared to the GAN. The generator network is trained, together with a discriminator network, during a prior offline or training stage and applied at step 104 during an online or inference stage. The training and architecture of the generator network is described in further detail below with respect to FIG. 2.

In one embodiment, for example where the generator network does not receive the enhancement map as input at step 102, the generator network generates the synthesized contrast enhanced medical image comprising a random enhancement pattern of one or more synthesized contrast enhanced regions of pathological tissue, e.g., using random noise or based on image features in the input medical image. In another embodiment, for example, where the generator network receives the enhancement map as input at step 102, the generator network generates the synthesized contrast enhanced medical image comprising one or more synthesized contrast enhanced regions of pathological tissue in the one or more regions defined by the enhancement map. In another embodiment, where segmentation masks for anatomical structures in the input medical image are received at step 102, the segmentation masks are also input into the generator network. The segmentation masks help the generator network to learn shape model constraints for generating better quality images.

At step 106, the synthesized contrast enhanced medical image is output. For example, the synthesized contrast enhanced medical image can be output by displaying the synthesized contrast enhanced medical image on a display device of a computer system, storing the synthesized contrast enhanced medical image on a memory or storage of a computer system, or by transmitting the synthesized contrast enhanced medical image to a remote computer system.

In one embodiment, the synthesized contrast enhanced medical image may be utilized for training a machine learning based system for performing a medical image analysis task, such as, e.g., segmentation of anatomical structures in contrast enhanced medical images.

In one embodiment, the generator network may be separately trained (to learn different weights) for generating synthesized contrast enhanced medical images for different pathologies with different contrast enhancement patterns (e.g., ischemic, hypertrophic cardiomyopathy, amyloidosis, etc.). Depending on the particular pathology, the contrast enhancement pattern may have different characteristics. The characteristics may include, e.g., transmurality (mid-wall, endocardial, epicardial, or fully transmural from endocardial to epicardial), patchy texture (for amyloidosis), continuous segment of various sizes, wall thinning, etc. Accordingly, from the same input medical image, different synthesized contrast enhanced medical images with different enhancement patterns for different pathologies may be generated using the generator network separately trained for the different pathologies.

In one embodiment, a segmentation mask of an anatomical structure (e.g., myocardium) in the synthesized contrast enhanced medical image may be generated. For example, in one embodiment, the spatial displacement between the input medical image and the synthesized contrast enhanced medical image is penalized by the trained machine learning based generator network. To penalize such spatial displacement, during training, a training input medical image and the real contrast enhanced medical image are initially aligned, e.g., using rigid and/or deformable registration. Accordingly, a segmentation mask for an anatomical structure in the input medical image (e.g., determined using known techniques) may be applied as the segmentation mask for the anatomical structure in the synthesized contrast enhanced medical image.

Figure 3:
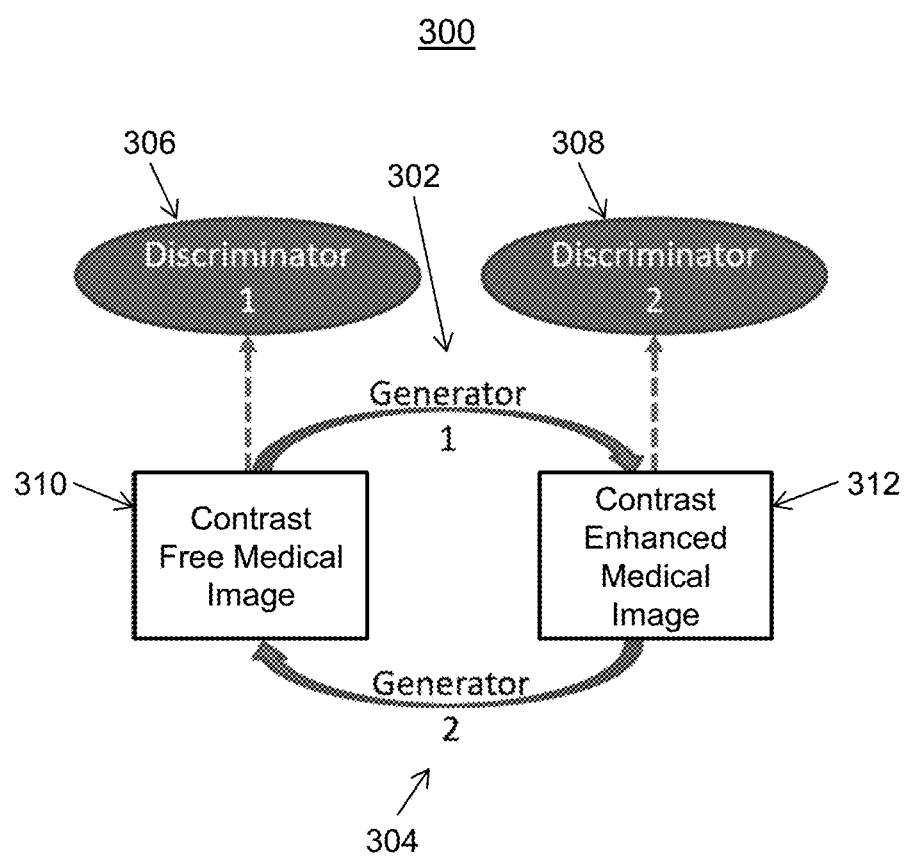
FIG. 3 shows a network architecture for training an exemplary cycleGAN, in accordance with one or more embodiments.

In another embodiment, for example where the trained machine learning based network applied at step 104 is a cycleGAN, a segmentation mask of the anatomical structure in the synthesized contrast enhanced medical image may be generated by generating a contrast-free medical image from the synthesized contrast enhanced medical image and determining a segmentation mask of the contrast-free medical image. FIG. 3 shows a network architecture for training an exemplary cycleGAN 300, in accordance with one or more embodiments. CycleGAN 300 comprises two generator networks, Generator 1 302 and Generator 2 304, and two discriminator networks, Discriminator 1 306 and Discriminator 2 308. Generator 1 302 generates a contrast enhanced medical image 312 (e.g., according to method 100 of FIG. 1) from a contrast free medical image 310 and Generator 2 304 generates a contrast free medical image 310 from a contrast enhanced medical image 312. During training, Discriminator 1 306 aims to distinguish between the synthesized contrast free medical image 310 and a real contrast free medical image (not shown) and Discriminator 2 aims to distinguish between the synthesized contrast enhanced medical image 312 and a real contrast enhanced medical image (not shown). The segmentation mask of the anatomical structure in the synthesized contrast enhanced medical image 312 may be obtained by using Generator 2 304 to generate a paired contrast free medical image (i.e., contrast free medical image 310) from the synthesized contrast enhanced medical image. A segmentation mask of the anatomical structure in the generated paired contrast free medical image 310 (e.g., determined using known techniques) may be applied as the segmentation mask for the anatomical structure in the synthesized contrast enhanced medical image.

Figure 4:
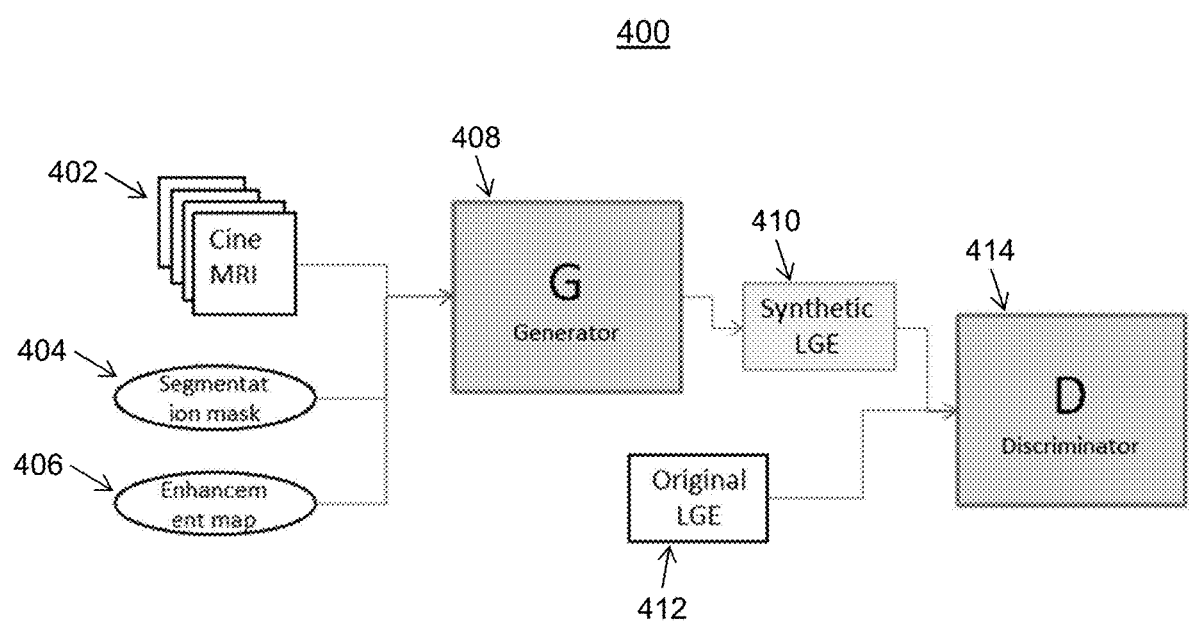
FIG. 4 shows a framework for training a machine learning based network for generating a synthesized contrast enhanced medical image, in accordance with one or more embodiments.

FIG. 4 shows a framework 400 for training a machine learning based network for generating a synthesized contrast enhanced medical image, in accordance with one or more embodiments. As shown in framework 400, the machine learning based network is a GAN comprising a generator network 408 and a discriminator network 414. However, the machine learning based network may be of any other suitable form, such as, e.g., a cycleGAN or SPADE GAN. Generator network 408 and discriminator network 414 are trained together during an offline or training phase as shown in framework 400. Once trained, generator network 408 is applied to generate synthesized contrast enhanced medical images during an online or inference stage. In one example, trained generator network 408 is the generator network applied at step 104 of method 100 of FIG. 1. Discriminator network 414 is only used during the training phase and is not applied during the inference stage.

Generator network 408 may be a deep neural network implemented using a convolutional encoder-decoder architecture that generates a synthesized contrast enhanced medical image. As shown in framework 400, cine MRI image 402 and optionally enhancement map 406 and segmentation mask 404 of anatomical structures depicted in cine MRI image 402 are input into generator network 408, which outputs synthetic LGE image 410. While FIG. 4 shows images 402 and 410 as cine MRI images 402 and synthetic LGE images 410 respectively, it should be understood that images 402 may be of any suitable modality and images 410 may be any synthesized contrast enhanced medical image. Synthetic LGE images 410 and original LGE images 412 are input into discriminator network 414. Original LGE images 412 are real LGE images. In one embodiment, cine MRI image 402 and original LGE image 412 show a same anatomy and are roughly co-registered. Discriminator network 414 may be another deep neural network that distinguishes between synthetic LGE images 410 and original LGE images 412. During training, generator network 408 and discriminator network 414 are trained together to optimize a minimax objective such that synthetic LGE images 410 become as close as possible from being indistinguishable from original LGE images 412 as evaluated by discriminator network 414.

Embodiments described herein are described with respect to the claimed systems as well as with respect to the claimed methods. Features, advantages or alternative embodiments herein can be assigned to the other claimed objects and vice versa. In other words, claims for the systems can be improved with features described or claimed in the context of the methods. In this case, the functional features of the method are embodied by objective units of the providing system.

Furthermore, embodiments described herein are described with respect to methods and systems for generating a synthesized contrast enhanced medical image using a trained machine learning based networks, as well as with respect to methods and systems for training machine learning based networks for generating a synthesized contrast enhanced medical image. Features, advantages or alternative embodiments herein can be assigned to the other claimed objects and vice versa. In other words, claims for methods and systems for training machine learning based networks can be improved with features described or claimed in context of the methods and systems for utilizing trained machine learning based networks, and vice versa.

In particular, the trained machine learning based networks of the methods and systems for generating a synthesized contrast enhanced medical image can adapted by the methods and systems for training the machine learning based networks for generating a synthesized contrast enhanced medical image. Furthermore, the input data of the trained machine learning based networks can comprise advantageous features and embodiments of the training input data, and vice versa. Furthermore, the output data of the trained machine learning based networks can comprise advantageous features and embodiments of the output training data, and vice versa.

In general, a trained machine learning based network mimics cognitive functions that humans associate with other human minds. In particular, by training based on training data, the trained machine learning based network is able to adapt to new circumstances and to detect and extrapolate patterns.

In general, parameters of a machine learning based network can be adapted by means of training. In particular, supervised training, semi-supervised training, unsupervised training, reinforcement learning and/or active learning can be used. Furthermore, representation learning (an alternative term is "feature learning") can be used. In particular, the parameters of the trained machine learning based network can be adapted iteratively by several steps of training.

In particular, a trained machine learning based network can comprise a neural network, a support vector machine, a decision tree, and/or a Bayesian network, and/or the trained machine learning based network can be based on k-means clustering, Q-learning, genetic algorithms, and/or association rules. In particular, a neural network can be a deep neural network, a convolutional neural network, or a convolutional deep neural network. Furthermore, a neural network can be an adversarial network, a deep adversarial network and/or a generative adversarial network.

Figure 5:
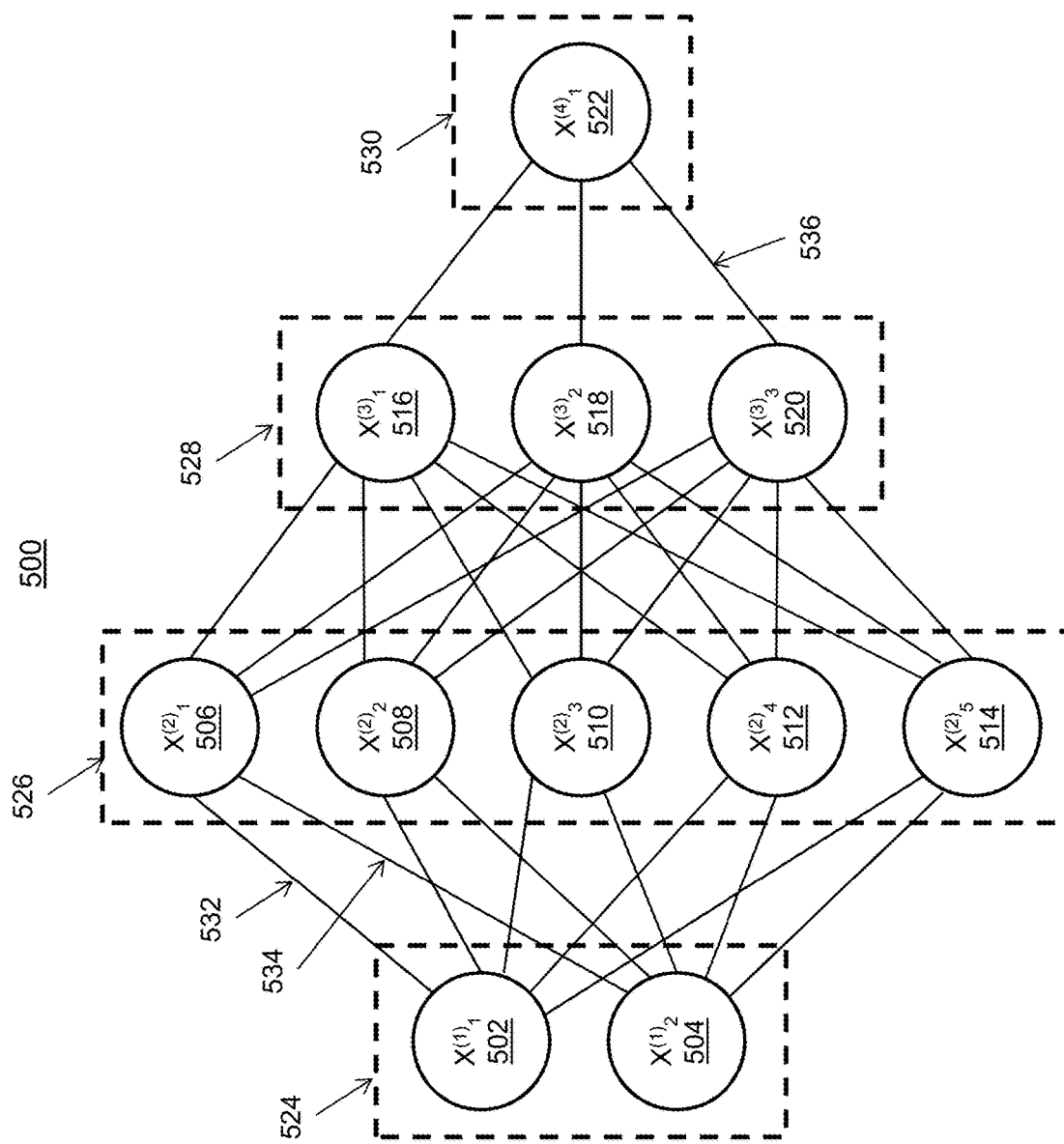
FIG. 5 shows an exemplary artificial neural network that may be used to implement one or more embodiments described herein.

FIG. 5 shows an embodiment of an artificial neural network 500, in accordance with one or more embodiments. Alternative terms for "artificial neural network" are "neural network", "artificial neural net" or "neural net". Machine learning networks described herein, such as, e.g., the trained machine learning based generator network applied at step 104 of FIG. 1, generator 1 302, generator 2 304, discriminator 1 306, and discriminator 2 308 of FIG. 3, and generator network 408 and discriminator network 414 of FIG. 4, may be implemented using artificial neural network 500.

The artificial neural network 500 comprises nodes 502-522 and edges 532, 534, . . . , 536, wherein each edge 532, 534, . . . , 536 is a directed connection from a first node 502-522 to a second node 502-522. In general, the first node 502-522 and the second node 502-522 are different nodes 502-522, it is also possible that the first node 502-522 and the second node 502-522 are identical. For example, in FIG. 5, the edge 532 is a directed connection from the node 502 to the node 506, and the edge 534 is a directed connection from the node 504 to the node 506. An edge 532, 534, . . . , 536 from a first node 502-522 to a second node 502-522 is also denoted as "ingoing edge" for the second node 502-522 and as "outgoing edge" for the first node 502-522.

In this embodiment, the nodes 502-522 of the artificial neural network 500 can be arranged in layers 524-530, wherein the layers can comprise an intrinsic order introduced by the edges 532, 534, . . . , 536 between the nodes 502-522. In particular, edges 532, 534, . . . , 536 can exist only between neighboring layers of nodes. In the embodiment shown in FIG. 5, there is an input layer 524 comprising only nodes 502 and 504 without an incoming edge, an output layer 530 comprising only node 522 without outgoing edges, and hidden layers 526, 528 in-between the input layer 524 and the output layer 530. In general, the number of hidden layers 526, 528 can be chosen arbitrarily. The number of nodes 502 and 504 within the input layer 524 usually relates to the number of input values of the neural network 500, and the number of nodes 522 within the output layer 530 usually relates to the number of output values of the neural network 500.

In particular, a (real) number can be assigned as a value to every node 502-522 of the neural network 500. Here, $x^{(n)}_i$ denotes the value of the i-th node 502-522 of the n-th layer 524-530. The values of the nodes 502-522 of the input layer 524 are equivalent to the input values of the neural network 500, the value of the node 522 of the output layer 530 is equivalent to the output value of the neural network 500. Furthermore, each edge 532, 534, . . . , 536 can comprise a weight being a real number, in particular, the weight is a real number within the interval [−1, 1] or within the interval [0, 1]. Here, $w^{(m,n)}_{i,j}$ denotes the weight of the edge between the i-th node 502-522 of the m-th layer 524-530 and the j-th node 502-522 of the n-th layer 524-530. Furthermore, the abbreviation $w^{(n)}_{i,j}$ is defined for the weight $w^{(n,n+1)}_{i,j}$.

In particular, to calculate the output values of the neural network 500, the input values are propagated through the neural network. In particular, the values of the nodes 502-522 of the (n+1)-th layer 524-530 can be calculated based on the values of the nodes 502-522 of the n-th layer 524-530 by $$x_j^{(n+1)} = f(\Sigma_i x_i^{(n)} \cdot w_{i,j}^{(n)}).$$

Herein, the function f is a transfer function (another term is "activation function"). Known transfer functions are step functions, sigmoid function (e.g. the logistic function, the generalized logistic function, the hyperbolic tangent, the Arctangent function, the error function, the smoothstep function) or rectifier functions. The transfer function is mainly used for normalization purposes.

In particular, the values are propagated layer-wise through the neural network, wherein values of the input layer 524 are given by the input of the neural network 500, wherein values of the first hidden layer 526 can be calculated based on the values of the input layer 524 of the neural network, wherein values of the second hidden layer 528 can be calculated based in the values of the first hidden layer 526, etc.

In order to set the values $w^{(m,n)}_{i,j}$ for the edges, the neural network 500 has to be trained using training data. In particular, training data comprises training input data and training output data (denoted as $t_i$). For a training step, the neural network 500 is applied to the training input data to generate calculated output data. In particular, the training data and the calculated output data comprise a number of values, said number being equal with the number of nodes of the output layer.

In particular, a comparison between the calculated output data and the training data is used to recursively adapt the weights within the neural network 500 (backpropagation algorithm). In particular, the weights are changed according to $$w'^{(n)}_{i,j} = w^{(n)}_{i,j} - \gamma \cdot \delta^{(n)}_j \cdot x^{(n)}_i$$

wherein $\gamma$ is a learning rate, and the numbers $\delta^{(n)}_j$ can be recursively calculated as $$\delta^{(n)}_j = (\Sigma_k \delta^{(n+1)}_k \cdot w^{(n+1)}_{j,k}) \cdot f'(\Sigma_i x^{(n)}_i \cdot w^{(n)}_{i,j})$$

based on $\delta^{(n+1)}_j$, if the (n+1)-th layer is not the output layer, and $$\delta^{(n)}_j = (x^{(n+1)}_k - t^{(n+1)}_j) \cdot f'(\Sigma_i x^{(n)}_i \cdot w^{(n)}_{i,j})$$

if the (n+1)-th layer is the output layer 530, wherein f' is the first derivative of the activation function, and $y^{(n+1)}_j$ is the comparison training value for the j-th node of the output layer 530.

Figure 6:
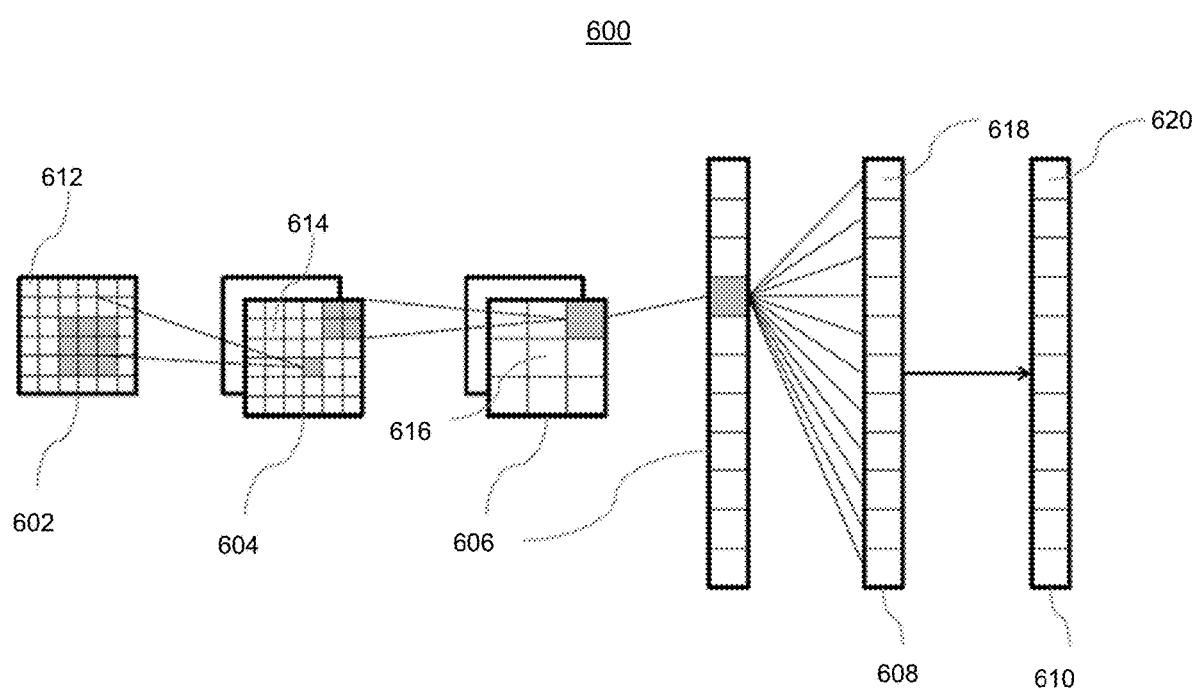
FIG. 6 shows a convolutional neural network that may be used to implement one or more embodiments described herein.

FIG. 6 shows a convolutional neural network 600, in accordance with one or more embodiments. Machine learning networks described herein, such as, e.g., the trained machine learning based generator network applied at step 104 of FIG. 1, generator 1 302, generator 2 304, discriminator 1 306, and discriminator 2 308 of FIG. 3, and generator network 408 and discriminator network 414 of FIG. 4, may be implemented using convolutional neural network 600.

In the embodiment shown in FIG. 6, the convolutional neural network comprises 600 an input layer 602, a convolutional layer 604, a pooling layer 606, a fully connected layer 608, and an output layer 610. Alternatively, the convolutional neural network 600 can comprise several convolutional layers 604, several pooling layers 606, and several fully connected layers 608, as well as other types of layers. The order of the layers can be chosen arbitrarily, usually fully connected layers 608 are used as the last layers before the output layer 610.

In particular, within a convolutional neural network 600, the nodes 612-620 of one layer 602-610 can be considered to be arranged as a d-dimensional matrix or as a d-dimensional image. In particular, in the two-dimensional case the value of the node 612-620 indexed with i and j in the n-th layer 602-610 can be denoted as $x^{(n)}_{[i,j]}$. However, the arrangement of the nodes 612-620 of one layer 602-610 does not have an effect on the calculations executed within the convolutional neural network 600 as such, since these are given solely by the structure and the weights of the edges.

In particular, a convolutional layer 604 is characterized by the structure and the weights of the incoming edges forming a convolution operation based on a certain number of kernels. In particular, the structure and the weights of the incoming edges are chosen such that the values $x^{(n)}_k$ of the nodes 614 of the convolutional layer 604 are calculated as a convolution $x^{(n)}_k = K_k * x^{(n-1)}$ based on the values $x^{(n-1)}$ of the nodes 612 of the preceding layer 602, where the convolution * is defined in the two-dimensional case as $$x^{(n)}_k[i,j] = (K_k * x^{(n-1)})[i,j] = \Sigma_{i'} \Sigma_{j'} K_k[i',j'] \cdot x^{(n-1)}[i-i',j-j'].$$

Here the k-th kernel $K_k$ is a d-dimensional matrix (in this embodiment a two-dimensional matrix), which is usually small compared to the number of nodes 612-618 (e.g. a 3×3 matrix, or a 5×5 matrix). In particular, this implies that the weights of the incoming edges are not independent, but chosen such that they produce said convolution equation. In particular, for a kernel being a 3×3 matrix, there are only 9 independent weights (each entry of the kernel matrix corresponding to one independent weight), irrespectively of the number of nodes 612-620 in the respective layer 602-610. In particular, for a convolutional layer 604, the number of nodes 614 in the convolutional layer is equivalent to the number of nodes 612 in the preceding layer 602 multiplied with the number of kernels.

If the nodes 612 of the preceding layer 602 are arranged as a d-dimensional matrix, using a plurality of kernels can be interpreted as adding a further dimension (denoted as "depth" dimension), so that the nodes 614 of the convolutional layer 614 are arranged as a (d+1)-dimensional matrix. If the nodes 612 of the preceding layer 602 are already arranged as a (d+1)-dimensional matrix comprising a depth dimension, using a plurality of kernels can be interpreted as expanding along the depth dimension, so that the nodes 614 of the convolutional layer 604 are arranged also as a (d+1)-dimensional matrix, wherein the size of the (d+1)-dimensional matrix with respect to the depth dimension is by a factor of the number of kernels larger than in the preceding layer 602.

The advantage of using convolutional layers 604 is that spatially local correlation of the input data can exploited by enforcing a local connectivity pattern between nodes of adjacent layers, in particular by each node being connected to only a small region of the nodes of the preceding layer.

In embodiment shown in FIG. 6, the input layer 602 comprises 36 nodes 612, arranged as a two-dimensional 6×6 matrix. The convolutional layer 604 comprises 72 nodes 614, arranged as two two-dimensional 6×6 matrices, each of the two matrices being the result of a convolution of the values of the input layer with a kernel. Equivalently, the nodes 614 of the convolutional layer 604 can be interpreted as arranges as a three-dimensional 6×6×2 matrix, wherein the last dimension is the depth dimension.

A pooling layer 606 can be characterized by the structure and the weights of the incoming edges and the activation function of its nodes 616 forming a pooling operation based on a non-linear pooling function f. For example, in the two dimensional case the values $x^{(n)}$ of the nodes 616 of the pooling layer 606 can be calculated based on the values $x^{(n-1)}$ of the nodes 614 of the preceding layer 604 as $$x^{(n)}[i,j] = f(x^{(n-1)}[id_1,jd_2], \ldots , x^{(n-1)}[id_1+d_1-1,jd_2+d_2-1])$$

In other words, by using a pooling layer 606, the number of nodes 614, 616 can be reduced, by replacing a number d1·d2 of neighboring nodes 614 in the preceding layer 604 with a single node 616 being calculated as a function of the values of said number of neighboring nodes in the pooling layer. In particular, the pooling function f can be the max-function, the average or the L2-Norm. In particular, for a pooling layer 606 the weights of the incoming edges are fixed and are not modified by training.

The advantage of using a pooling layer 606 is that the number of nodes 614, 616 and the number of parameters is reduced. This leads to the amount of computation in the network being reduced and to a control of overfitting.

In the embodiment shown in FIG. 6, the pooling layer 606 is a max-pooling, replacing four neighboring nodes with only one node, the value being the maximum of the values of the four neighboring nodes. The max-pooling is applied to each d-dimensional matrix of the previous layer; in this embodiment, the max-pooling is applied to each of the two two-dimensional matrices, reducing the number of nodes from 72 to 18.

A fully-connected layer 608 can be characterized by the fact that a majority, in particular, all edges between nodes 616 of the previous layer 606 and the nodes 618 of the fully-connected layer 608 are present, and wherein the weight of each of the edges can be adjusted individually.

In this embodiment, the nodes 616 of the preceding layer 606 of the fully-connected layer 608 are displayed both as two-dimensional matrices, and additionally as non-related nodes (indicated as a line of nodes, wherein the number of nodes was reduced for a better presentability). In this embodiment, the number of nodes 618 in the fully connected layer 608 is equal to the number of nodes 616 in the preceding layer 606. Alternatively, the number of nodes 616, 618 can differ.

Furthermore, in this embodiment, the values of the nodes 620 of the output layer 610 are determined by applying the Softmax function onto the values of the nodes 618 of the preceding layer 608. By applying the Softmax function, the sum the values of all nodes 620 of the output layer 610 is 1, and all values of all nodes 620 of the output layer are real numbers between 0 and 1.

A convolutional neural network 600 can also comprise a ReLU (rectified linear units) layer. In particular, the number of nodes and the structure of the nodes contained in a ReLU layer is equivalent to the number of nodes and the structure of the nodes contained in the preceding layer. In particular, the value of each node in the ReLU layer is calculated by applying a rectifying function to the value of the corresponding node of the preceding layer. Examples for rectifying functions are $f(x)=\max(0,x)$, the tangent hyperbolics function or the sigmoid function.

In particular, convolutional neural networks 600 can be trained based on the backpropagation algorithm. For preventing overfitting, methods of regularization can be used, e.g. dropout of nodes 612-620, stochastic pooling, use of artificial data, weight decay based on the L1 or the L2 norm, or max norm constraints.

Systems, apparatuses, and methods described herein may be implemented using digital circuitry, or using one or more computers using well-known computer processors, memory units, storage devices, computer software, and other components. Typically, a computer includes a processor for executing instructions and one or more memories for storing instructions and data. A computer may also include, or be coupled to, one or more mass storage devices, such as one or more magnetic disks, internal hard disks and removable disks, magneto-optical disks, optical disks, etc.

Systems, apparatus, and methods described herein may be implemented using computers operating in a client-server relationship. Typically, in such a system, the client computers are located remotely from the server computer and interact via a network. The client-server relationship may be defined and controlled by computer programs running on the respective client and server computers.

Systems, apparatus, and methods described herein may be implemented within a network-based cloud computing system. In such a network-based cloud computing system, a server or another processor that is connected to a network communicates with one or more client computers via a network. A client computer may communicate with the server via a network browser application residing and operating on the client computer, for example. A client computer may store data on the server and access the data via the network. A client computer may transmit requests for data, or requests for online services, to the server via the network. The server may perform requested services and provide data to the client computer(s). The server may also transmit data adapted to cause a client computer to perform a specified function, e.g., to perform a calculation, to display specified data on a screen, etc. For example, the server may transmit a request adapted to cause a client computer to perform one or more of the steps or functions of the methods and workflows described herein, including one or more of the steps or functions of FIG. 1. Certain steps or functions of the methods and workflows described herein, including one or more of the steps or functions of FIG. 1, may be performed by a server or by another processor in a network-based cloud-computing system. Certain steps or functions of the methods and workflows described herein, including one or more of the steps of FIG. 1, may be performed by a client computer in a network-based cloud computing system. The steps or functions of the methods and workflows described herein, including one or more of the steps of FIG. 1, may be performed by a server and/or by a client computer in a network-based cloud computing system, in any combination.

Systems, apparatus, and methods described herein may be implemented using a computer program product tangibly embodied in an information carrier, e.g., in a non-transitory machine-readable storage device, for execution by a programmable processor; and the method and workflow steps described herein, including one or more of the steps or functions of FIG. 1, may be implemented using one or more computer programs that are executable by such a processor. A computer program is a set of computer program instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Figure 7:
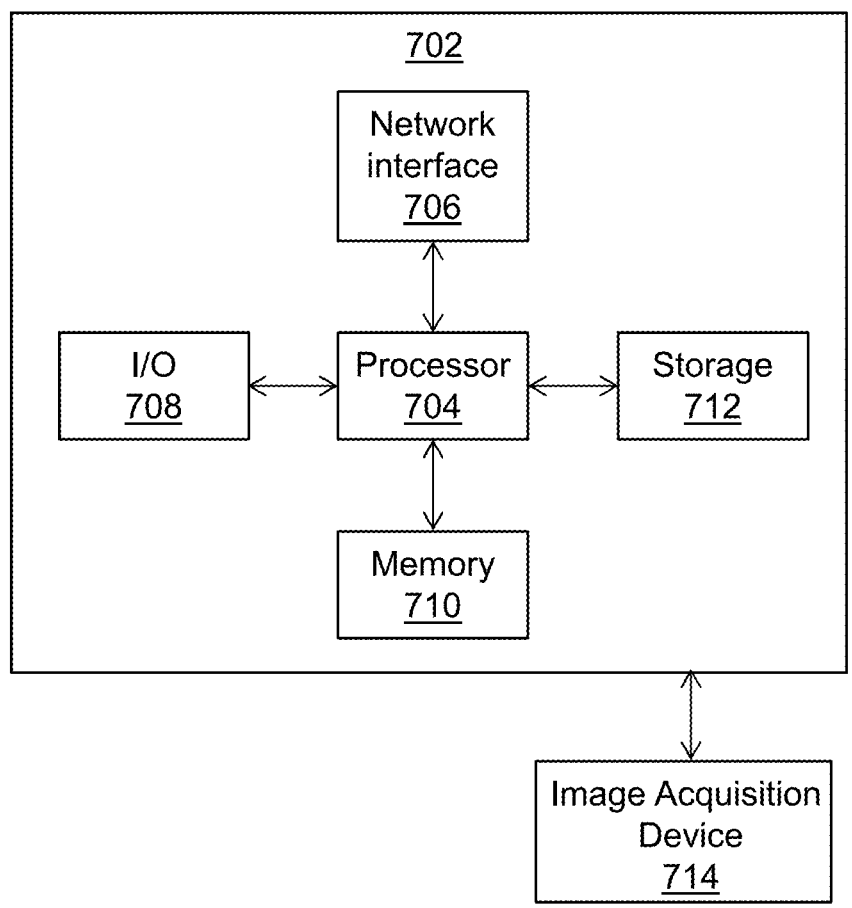
FIG. 7 shows a high-level block diagram of a computer that may be used to implement one or more embodiments described herein.

A high-level block diagram of an example computer 702 that may be used to implement systems, apparatus, and methods described herein is depicted in FIG. 7. Computer 702 includes a processor 704 operatively coupled to a data storage device 712 and a memory 710. Processor 704 controls the overall operation of computer 702 by executing computer program instructions that define such operations. The computer program instructions may be stored in data storage device 712, or other computer readable medium, and loaded into memory 710 when execution of the computer program instructions is desired. Thus, the method and workflow steps or functions of FIG. 1 can be defined by the computer program instructions stored in memory 710 and/or data storage device 712 and controlled by processor 704 executing the computer program instructions. For example, the computer program instructions can be implemented as computer executable code programmed by one skilled in the art to perform the method and workflow steps or functions of FIG. 1. Accordingly, by executing the computer program instructions, the processor 704 executes the method and workflow steps or functions of FIG. 1. Computer 702 may also include one or more network interfaces 706 for communicating with other devices via a network. Computer 702 may also include one or more input/output devices 708 that enable user interaction with computer 702 (e.g., display, keyboard, mouse, speakers, buttons, etc.).

Processor 704 may include both general and special purpose microprocessors, and may be the sole processor or one of multiple processors of computer 702. Processor 704 may include one or more central processing units (CPUs), for example. Processor 704, data storage device 712, and/or memory 710 may include, be supplemented by, or incorporated in, one or more application-specific integrated circuits (ASICs) and/or one or more field programmable gate arrays (FPGAs).

Data storage device 712 and memory 710 each include a tangible non-transitory computer readable storage medium. Data storage device 712, and memory 710, may each include high-speed random access memory, such as dynamic random access memory (DRAM), static random access memory (SRAM), double data rate synchronous dynamic random access memory (DDR RAM), or other random access solid state memory devices, and may include non-volatile memory, such as one or more magnetic disk storage devices such as internal hard disks and removable disks, magneto-optical disk storage devices, optical disk storage devices, flash memory devices, semiconductor memory devices, such as erasable programmable read-only memory (EPROM), electrically erasable programmable read-only memory (EEPROM), compact disc read-only memory (CD-ROM), digital versatile disc read-only memory (DVD-ROM) disks, or other non-volatile solid state storage devices.

Input/output devices 708 may include peripherals, such as a printer, scanner, display screen, etc. For example, input/output devices 708 may include a display device such as a cathode ray tube (CRT) or liquid crystal display (LCD) monitor for displaying information to the user, a keyboard, and a pointing device such as a mouse or a trackball by which the user can provide input to computer 702.

An image acquisition device 714 can be connected to the computer 702 to input image data (e.g., medical images) to the computer 702. It is possible to implement the image acquisition device 714 and the computer 702 as one device. It is also possible that the image acquisition device 714 and the computer 702 communicate wirelessly through a network. In a possible embodiment, the computer 702 can be located remotely with respect to the image acquisition device 714.

Any or all of the systems and apparatus discussed herein, including the trained machine learning based generator network applied at step 104 of FIG. 1, generator 1 302, generator 2 304, discriminator 1 306, and discriminator 2 308 of FIG. 3, generator network 408 and discriminator network 414 of FIG. 4, the artificial neural network 500 of FIG. 5, and the convolutional neural network 600 of FIG. 6, may be implemented using one or more computers such as computer 702.

One skilled in the art will recognize that an implementation of an actual computer or computer system may have other structures and may contain other components as well, and that FIG. 7 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A computer implemented method comprising:
receiving an input medical image of healthy tissue;
generating a synthesized contrast enhanced medical image based on the input medical image of the healthy tissue using a trained machine learning based generator network, the synthesized contrast enhanced medical image comprising one or more synthesized contrast enhanced regions of pathological tissue; and
outputting the synthesized contrast enhanced medical image.

2. The computer implemented method of claim 1, wherein generating a synthesized contrast enhanced medical image based on the input medical image of the healthy tissue using a trained machine learning based generator network comprises:
generating the synthesized contrast enhanced medical image comprising a random pattern of the one or more synthesized contrast enhanced regions.

3. The computer implemented method of claim 1, further comprising receiving an enhancement map defining one or more regions of the input medical image to be contrast enhanced, wherein generating a synthesized contrast enhanced medical image based on the input medical image of the healthy tissue using a trained machine learning based generator network comprises:
generating the synthesized contrast enhanced medical image based on the enhancement map, wherein the one or more synthesized contrast enhanced regions of pathological tissue in the synthesized contrast enhanced medical image are generated in the one or more regions defined by the enhancement map.

4. The computer implemented method of claim 3, further comprising:
generating the enhancement map based on a thresholded strain map.

5. The computer implemented method of claim 3, further comprising:
generating the enhancement map based on a segmentation mask associated with an anatomically similar patient.

6. The computer implemented method of claim 1, further comprising receiving a segmentation mask of an anatomical structure depicted in the input medical image, wherein generating a synthesized contrast enhanced medical image based on the input medical image of the healthy tissue using a trained machine learning based generator network comprises:
generating the synthesized contrast enhanced medical image based on the segmentation mask using the trained machine learning based generator network.

7. The computer implemented method of claim 1, further comprising:
determining a segmentation mask of an anatomical structure depicted in the synthesized contrast enhanced medical image as a segmentation mask of the anatomical structure in the input medical image.

8. The computer implemented method of claim 1, further comprising:
generating a segmentation mask of an anatomical structure depicted in the synthesized contrast enhanced medical image by:

generating a paired non-enhanced medical image of the anatomical structure depicted in the synthesized contrast enhanced medical image using another generator network; and determining a segmentation mask of the generated paired non-enhanced medical image.

9. The computer implemented method of claim 1, further comprising:

training a machine learning based system for performing a medical image analysis task based on the synthesized contrast enhanced medical image.

10. The computer implemented method of claim 1, wherein the input medical image is a cine MRI (magnetic resonance imaging) image and the synthesized contrast enhanced medical image is a synthesized LGE (late gadolinium enhancement) MRI image.

11. An apparatus comprising:

means for receiving an input medical image of healthy tissue;

means for generating a synthesized contrast enhanced medical image based on the input medical image of the healthy tissue using a trained machine learning based generator network, the synthesized contrast enhanced medical image comprising one or more synthesized contrast enhanced regions of pathological tissue; and means for outputting the synthesized contrast enhanced medical image.

12. The apparatus of claim 11, wherein the means for generating a synthesized contrast enhanced medical image based on the input medical image of the healthy tissue using a trained machine learning based generator network comprises:

means for generating the synthesized contrast enhanced medical image comprising a random pattern of the one or more synthesized contrast enhanced regions.

13. The apparatus of claim 11, further comprising means for receiving an enhancement map defining one or more regions of the input medical image to be contrast enhanced, wherein the means for generating a synthesized contrast enhanced medical image based on the input medical image of the healthy tissue using a trained machine learning based generator network comprises:

means for generating the synthesized contrast enhanced medical image based on the enhancement map, wherein the one or more synthesized contrast enhanced regions of pathological tissue in the synthesized contrast enhanced medical image are generated in the one or more regions defined by the enhancement map.

14. The apparatus of claim 13, further comprising:

means for generating the enhancement map based on a thresholded strain map or based on a segmentation mask associated with an anatomically similar patient.

15. A non-transitory computer readable medium storing computer program instructions, the computer program instructions when executed by a processor cause the processor to perform operations comprising:

receiving an input medical image of healthy tissue;

generating a synthesized contrast enhanced medical image based on the input medical image of the healthy tissue using a trained machine learning based generator network, the synthesized contrast enhanced medical image comprising one or more synthesized contrast enhanced regions of pathological tissue; and outputting the synthesized contrast enhanced medical image.

16. The non-transitory computer readable medium of claim 15, the operations further comprising receiving an enhancement map defining one or more regions of the input medical image to be contrast enhanced, wherein generating a synthesized contrast enhanced medical image based on the input medical image of the healthy tissue using a trained machine learning based generator network comprises:

generating the synthesized contrast enhanced medical image comprising the one or more synthesized contrast enhanced regions of pathological tissue in the one or more regions defined by the enhancement map.

17. The non-transitory computer readable medium of claim 15, the operations further comprising receiving a segmentation mask of an anatomical structure depicted in the input medical image, wherein generating a synthesized contrast enhanced medical image based on the input medical image of the healthy tissue using a trained machine learning based generator network comprises:

generating the synthesized contrast enhanced medical image based on the segmentation mask using the trained machine learning based generator network.

18. The non-transitory computer readable medium of claim 15, the operations further comprising:

determining a segmentation mask of an anatomical structure depicted in the synthesized contrast enhanced medical image as a segmentation mask of the anatomical structure in the input medical image.

19. The non-transitory computer readable medium of claim 15, the operations further comprising:

generating a segmentation mask of an anatomical structure depicted in the synthesized contrast enhanced medical image by:

generating a paired non-enhanced medical image of the anatomical structure depicted in the synthesized contrast enhanced medical image using another generator network; and determining a segmentation mask of the generated paired non-enhanced medical image.

20. The non-transitory computer readable medium of claim 15, the operations further comprising:

training a machine learning based system for performing a medical image analysis task based on the synthesized contrast enhanced medical image.

\* \* \* \* \*